United States Patent [19]

Skipper

[11] Patent Number: 5,027,028
[45] Date of Patent: Jun. 25, 1991

[54] PIEZOELECTRIC MOTOR

[76] Inventor: John D. Skipper, 3210 Roma Ave. NE., Albuquerque, N. Mex. 87106

[21] Appl. No.: 400,286

[22] Filed: Aug. 29, 1989

[51] Int. Cl.$^5$ .......................................... H01L 41/08
[52] U.S. Cl. .................................. 310/328; 310/323; 310/366; 310/333
[58] Field of Search ........ 310/323, 328, 333, 330-332, 310/366

[56] References Cited

U.S. PATENT DOCUMENTS

| | | | |
|---|---|---|---|
| 2,434,648 | 1/1948 | Goodale, Jr. et al. | 310/337 X |
| 3,127,527 | 3/1964 | Elston et al. | 310/337 X |
| 3,177,382 | 4/1965 | Green | 310/337 X |
| 3,370,187 | 2/1968 | Straube | 310/330 |
| 4,202,605 | 5/1980 | Heinz | 310/328 X |
| 4,523,120 | 6/1985 | Assard | 310/333 X |
| 4,628,275 | 12/1986 | Skipper et al. | 330/10 |
| 4,757,223 | 7/1988 | Ueyama | 310/328 X |
| 4,775,815 | 11/1988 | Heinz | 310/328 |
| 4,782,262 | 11/1988 | Kiyo-Oka | 310/323 |

FOREIGN PATENT DOCUMENTS

| | | | |
|---|---|---|---|
| 0138469 | 10/1981 | Japan | 310/328 |
| 0022477 | 2/1985 | Japan | 310/328 |
| 0817811 | 4/1981 | U.S.S.R. | 310/323 |
| 2205680 | 12/1988 | United Kingdom | 310/333 |

OTHER PUBLICATIONS

Piezoelectric Actuators Generate Many Motion Patterns, Lyle H. McCarty, pp. 136-138, Design News-/6-8-87.
A New Concept in Motors: Ultrasonic Wave Oscillation Drive Energy, Journal of Electrical Engineering, Jan. 1988, pp. 42-44.
Novel Three-Dimensional Positioner and Scanner for the STM Using Shear Deformation of Piezoceramic Plates, Uozumi et al., Jan. 88, pp. L123-126.

Primary Examiner—Mark O. Budd
Attorney, Agent, or Firm—Charles C. Wells

[57] ABSTRACT

A piezoelectric motor having a cylindrical outer motor casing formed by a separable two part housing that encloses and supports 3 piezoelectric actuators and a group of rotatable components. The rotatable components include a rotating output shaft that extends from the housing for coupling a load thereto, three drive rollers that engage the output shaft and are evenly spaced thereabout, and an idler ring assembly that secures the drive rollers about the output shaft when the motor is assembled. The housing has six piezoelectric stacks mounted in a fixed position to interior surfaces of the housing. Each stack is cylindrical with one flat end attached to the housing and the other flat end having a truncated cone shaped crown roller mounted thereon. The stacks are positioned so that when the two housing parts are assembled the piezoelectric stacks are aligned in pairs with their crown rollers adjacent each other to provide three piezoelectric actuators evenly spaced at 120 degree intervals about the center line of the motor. The three piezoelectric actuators support and position the rotatable components within the assembled housing during motor operation. When electrically energized by at least a pair of out of phase sinusoidal voltages the stacks deform along two perpendicular axes so that the crown rollers nutate in a substantially circular motion while bearing against internal surfaces of the three drive rollers to cause rotation of the drive rollers. External surfaces of the drive rollers engage the output shaft to cause it to rotate. Power amplifiers that provide the voltage drive required by high capacitive devices such as this motor are disclosed in U.S. Pat. No. 4,628,275 referenced in this patent application.

7 Claims, 2 Drawing Sheets

PIEZOELECTRIC MOTOR

BACKGROUND OF THE INVENTION

1. Field of the Invention

This invention is in the field of piezoelectric devices and more particularly it relates to a piezoelectric motor employing unique piezoelectric stacks and associated rotating components to provide a rotary actuator.

2. Description of the Prior Art

Pieoelectric actuators are known for their high output force, wide bandwidth response and high efficiency. Piezoelectric stacks have been constructed that operate in the extension mode, that is they become longer when a voltage is applied thereto. Piezoelectric stacks can also be made to operate in a shear mode if properly electrically poled so that the stack moves laterally rather than becoming longer. So far as known shear mode stacks made heretofore were capable only of motion along one axis. Controlled motion from piezoelectric actuators, including rotary motion, has been achieved but known actuators have been capable of only very small movement and limited power and speed. Prior devices have not fully capitalized on actuator potential. Miniature piezoelectric actuators developed by Micro Pulse Systems Inc. that are capable of linear and rotary motion are briefly described in an article entitled Piezoelectric Actuators Generate Many Motion Patterns appearing on page 136 of the 6-8-87 issue of Design News. A mount for a laser mirror that employs a piezoelectric actuator capable of shear type deformation along a single axis is disclosed in U.S. Pat. No. 4,775,815 issued to Theodore Heinz on Oct. 4, 1988. In the Heinz patent the shear motion of piezoelectric actuators are amplified by mechanical linkages connected between the piezoelectric actuators and the mirror mount.

Yet another known method of producing rotary motion from piezoelectric elements is the ultrasonic wave motor described on page 42 of the January 1988 issue of the Journal of Electric Engineering. In such a wave motor a traveling wave of acoustic energy is generated in a ring shaped elastic body by a ring shaped piezoelectric element adhered to the plastic body. The plastic body and piezoelectric element forms the stator of the motor. The traveling wave generates ripples or waves on the otherwise smooth surface of the stator that contact the surface of a rotor element mounted adjacent thereto and impart motion to the rotor. The wave motor can be made into a linear actuator by forming the stator and rotor in a line rather than ring shaped.

SUMMARY OF THE INVENTION

An object of the invention is to provide a powerful and silent piezoelectric driven motor that can produce high or low speed rotary motion.

Another object of the invention is to provide a motor utilizing piezoelectric actuators that are capable of shear deformation in both directions along two axes perpendicular to each other.

Yet another object of the invention is to provide a voltage source that delivers voltages to the piezoelectric actuators of the motor that causes the moveable end of the actuators to move in a circular motion.

These objects and others are accomplished by a piezoelectric motor that has a cylindrical outer motor casing or housing formed by two separable housing parts and a spacer ring. The housing parts are separable to permit assembly and disassembly of the motor. The casing has three piezoelectric actuators mounted therein and a group of rotatable components are supported in the casing by the actuators. Each piezoelectric actuator consists of two cylindrical stacks with one stack being mounted in a fixed position in each housing part so that the actuators are mounted in pairs in an opposed relation. The stacks are positioned such that the longitudinal axes of the stacks coincide and the moveable ends thereof face each other. A crown roller having a truncated cone shape has its base section fixed to the moveable end of each stack so that tapered bearing surfaces on the crown rollers can contact the rotating components of the motor when a voltage is applied to the stacks. Ball bearings are positioned between the apexes of the truncated cone shaped crown rollers when the motor is assembled. The dimensions of the motor components are such that a desired preload is applied to the piezoelectric stacks by the ball bearings when the motor is bolted together. The rotating components include a rotating output shaft supported so that the longitudinal axis of the output shaft coincides with the centerline of the motor casing. The output shaft has cone shaped bearing surfaces formed thereon. Three hollow drive rollers that have cone shaped internal and external bearing surfaces that match the bearing surfaces on the output shaft and the crown rollers are positioned at 120 degree intervals about the output shaft. The external bearing surfaces of the drive rollers contact the bearing surfaces of the output shaft so that rotation of the drive rollers is transferred to the output shaft. The internal surfaces of the drive rollers are positioned over the crown rollers of the actuators so that when the actuators are energized and the crown rollers move in a circular or nutating motion the crown rollers contact the internal bearing surfaces of the drive rollers with great force and impart rotation thereto. An idler ring assembly retains the drive rollers in position about the output shaft. The actuators are energized by a power source that includes at least a pair of voltages with one voltage 90 degrees out of phase with the other. The tremendous force produced by the actuators presses the bearing surfaces together in a manner analgous to the wheels of a locomotive against the rails of a railroad track. Due to its weight, and thus the force exerted on the rails by the locomotive wheels, the locomotive can pull thousands of tons along a track even though the reaction force occurs in an area the size of a dime where each driving wheel contacts the rails.

Other objects and advantages of the invention will be apparent to those skilled in the art when considering the drawings and following detailed description of the invention.

DETAILED DESCRIPTION OF THE INVENTION

Figure 2:
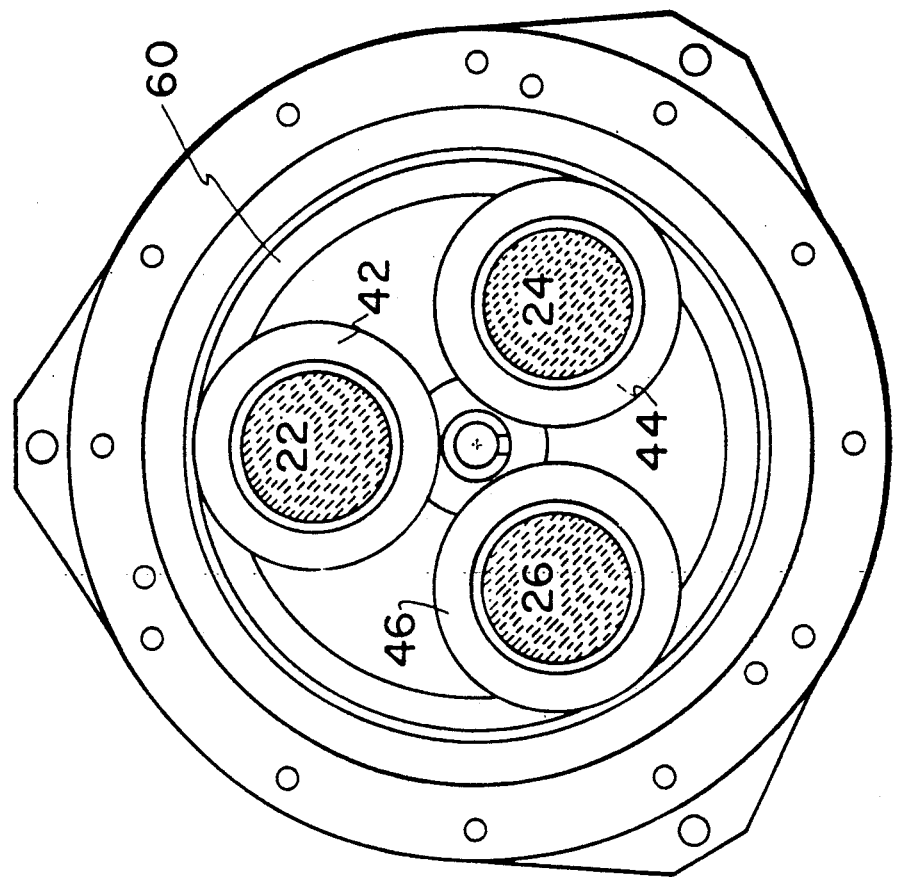
FIG. 2 is a view taken along lines 2—2 in FIG. 1 with the right hand housing and spacing ring, as viewed in FIG. 1, removed.
Figure 1:
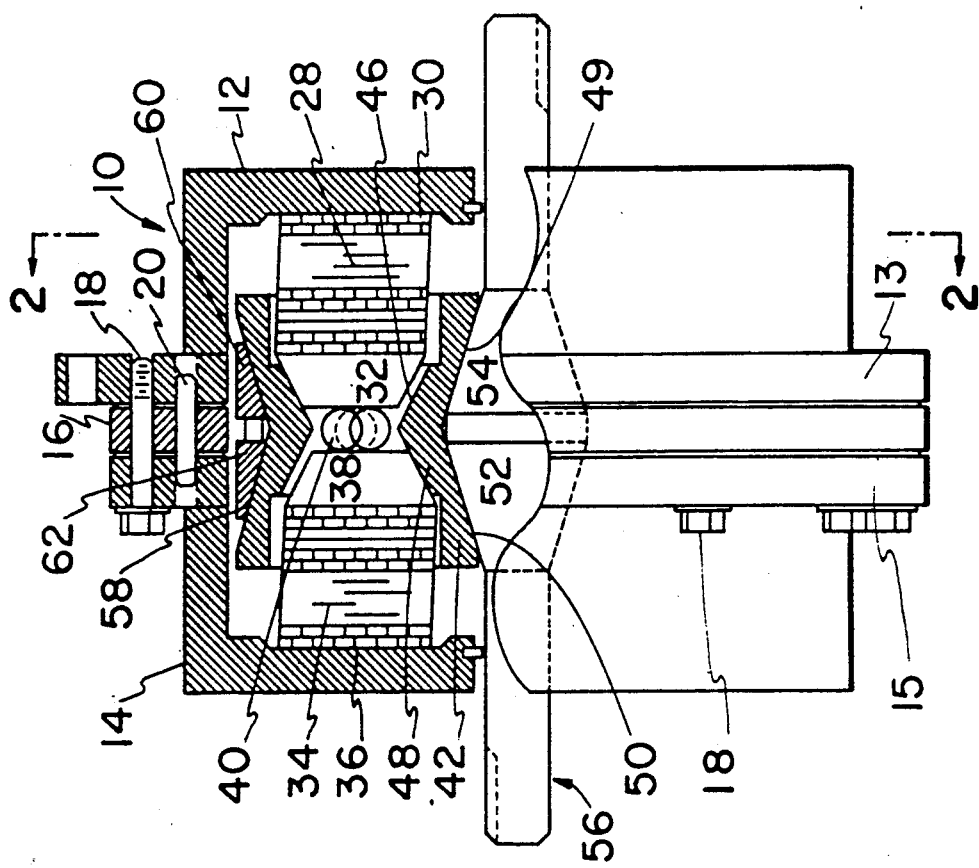
FIG. 1 is a view, partially in cross section, of an assembled piezoelectric motor that illustrates the position of the piezoelectric actuators and crown rollers relative to the other components of the motor when a voltage is applied to the actuators.

The piezoelectric motor shown in FIG. 1 has a cylindrical casing or housing 10 made up of housing sections 12 and 14 separated by a spacer ring 16 and suitable gaskets. The housings include bolt rings 13 and 15 for easy assembly and disassembly using bolts 18. Alignment pins, such as pin 20, are employed to facilitate assembly. Three identical piezoelectric actuators 22, 24, and 26 are mounted in casing 10 and their 120 degree spacing about the centerline of the motor is shown in FIG. 2. Since the actuators are identical and each includes two identical piezoelectric stacks only one actuator and one stack will be described and illustrated in detail.

Figure 5:
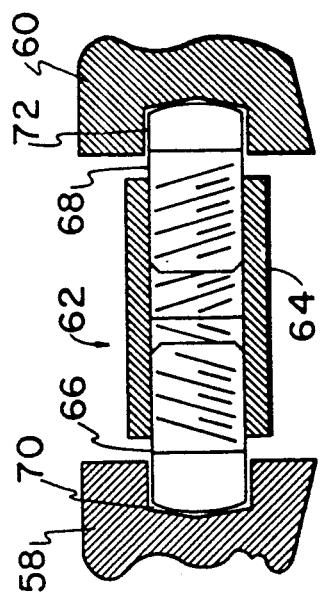
FIG. 5 is an enlarged sectional view of a suitable device for spreading the rings making up the idler rings assembly to adjust the inward pressure applied to the drive rollers.

Actuator 22 includes a piezoelectric stack 28 having one end 30 bonded to an interior wall of housing 12. A crown roller 32 having a truncated conical shape is bonded at its base to the other or free end of the actuator. Actuator 22 also includes a second piezoelectric stack 34 having end 36 bonded with epoxy or other suitable adhesive to an interior wall of housing 14. A crown roller 38 is bonded to stack 34. Stacks 28 and 34 are mounted so that their longitudinal axes coincide when the stacks have no voltage applied thereto. Three ball bearings 40 are positioned between the crown rollers when the motor is finally assembled so that when housings 12 and 14 are bolted together crown rollers 32 and 38 bear against the ball bearing and apply a desired compressive preload in the range of 100-500 pounds to the stacks of the actuator. Three identical hollow drive rollers 42, 44 and 46 are positioned within the housing so that they fit over the crown rollers of each actuator. Drive roller 42 has inner conical bearing surfaces 46 and 48 that contact the matching tapered bearing surfaces of crown rollers 32 and 38 during operation of the motor. Drive roller 42 also has outer conical bearing surfaces 49 and 50 that contact matching conical bearing surfaces 52 and 54 on output shaft 56. An idler ring assembly consisting of two idler rings 58 and 60 and at least three adjustment mechanisms 62, see FIG. 5, retain the drive rollers in a position about output shaft 56 and maintains high pressure contact between the bearing surfaces of the drive roller and the output shaft. Idler rings 58 and 60 can be spread apart by adjustment mechanism 62 to increase the bearing force of the drive rollers against the output shaft. The adjustment mechanisms 62 include an internally threaded square tube 64 in which two oppositely threaded studs 66 and 68 are mounted. Studs 66, 68 have squared off ends that fit into matching recesses 70 and 72 in idler rings 58 and 60. Adjustment mechanism 62 functions like a turnbuckle in that rotation of tube 64 will either spread the idler rings apart or reduce the force holding the idler rings apart, depending upon the direction tube 64 is turned.

Figure 4:
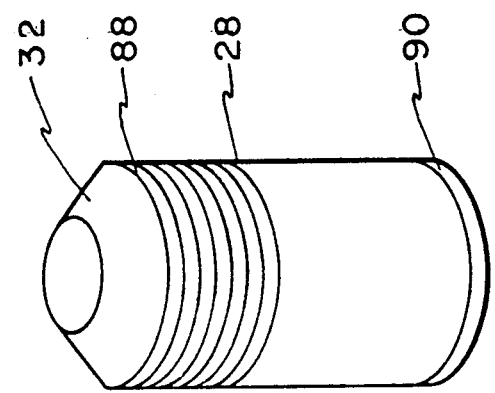
FIG. 4 illustrates a cylindrical piezoelectric stack as used in the invention.
Figure 3:
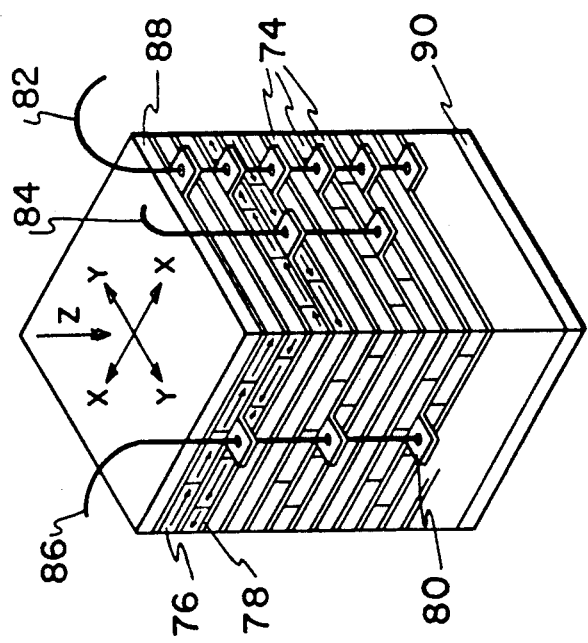
FIG. 3 is a view of a piezoelectric stack that is shown in a square configuration to facilitate illustrating the polarity and arrangement of the wafers making up the stack.

Referring now to FIGS. 3 and 4, the construction and operation of the piezoelectric stack that functions as a two axis shear block will be described. FIG. 3 is shown square to facilitate illustrating the polarity and construction of the wafers making up the stack. A cylindrical stack like that shown in FIG. 4 could be fabricated by shaping a square stack to a cylindrical shape or shaping the individual wafers making up the stack and then bonding them together. The stack is constructed of ceramic wafers that are polarized and electroded to deform in the shear deformation mode known as $d_{15}$ in conventional notation. This is known technology, but briefly, such piezoelectric elements are produced by applying temporary electrodes to a block of piezoelectric ceramic and then applying a 50,000 volt polarizing voltage to the electrodes while the block is submerged in hot oil or other dielectric. The voltage is maintained while the ceramic block is cooled below the Curie temperature. The ceramic block is poled by this process because the process orients the electrical dipoles within the material along the external electric field lines. When cooled the dipoles in the material remain frozen in the oriented position. The temporary electrodes are dissolved away and the block cut into wafer sections 0.50 inches thick with their polarization vectors oriented along the width of the wafer section.

FIG. 3 illustrates how the stack is composed of a large number of ceramic wafers or layers 74 and each wafer or layer 74 consists of several wafer sections 76. Four wafer sections per layer is shown in FIG. 3 but any number of wafer sections could be employed so long as the polarization vectors of all the wafer sections in a layer are oriented in the same direction. The wafer sections are laid in staggered brick-like fashion with electrodes 78 interleaved between the wafers. The interleaved electrodes are made of thin perforated metal or metal mesh and are bonded to the wafers. Solder tabs 80 extend from the electrodes to the outside of the stack so that electrical wires 82, 84, and 86 can be attached thereto for connecting an electrical signal to the stack. In FIG. 3 arrows are used in the top four wafers of the stack to indicate the direction of polarization and the axis along which the wafer will deform when an appropriate electrical signal is applied thereto. The entire stack is arranged in alternate layer pairs. One layer pair carrying arrow indications of polarity is illustrated by the second and third layers from the top in FIG. 3. Each layer of this pair moves or shears in both directions along an axis indicated by x in FIG. 3. The fourth and fifth layers from the top shear in the same manner but along axis y. The direction of the electric field induced by the applied voltage is reversed in each layer but so is the polarization vector of each layer.

The voltage applied to the stack is configured so that the shear deformation of the stack is cumulative. About 50 layer pairs are required to achieve a crown roller deflection of 0.010 inches in the plus or minus direction with an applied voltage of plus or minus 500 volts. When the stack is made of alternate layer pairs like that disclosed, and a sinusoidal voltage is applied between wires 86 and 82, it produces bipolar motion of half the layers along axis x. A voltage applied between 84 and 82 results in bipolar motion of the other half of the layers along axis y. When the actuator is driven along two axes by sinusoidal voltages approximately 90 degrees out of phase the motions add vectorially and the end result is that the free end of the stack moves in a circle. The crown roller bonded thereto moves with it and describes a nutating motion. The crown rollers contact the inside of the drive roller and convert this nutation to drive roller rotation by nonslipping contact with the drive roller. The points of contact of the two crown rollers of an actuator with the inside of its associated drive roller are diametrically opposed at all times during the nutating motion. The drive roller rotates in the same direction that the crown roller nutates. Wafers 88 and 90 of unpolarized material are bonded to each end of the stack to serve as bases and insulating layers for bonding the stack to the housing walls and the crown rollers to the stacks.

A large compressive preload is applied to the stack in the direction of arrow z, see FIG. 3, by ball bearings 40 positioned between the crown rollers when the motor is assembled. This preload does not affect the shear movement of the stack, but it assists in holding the stack together under high loads.

Figure 6:
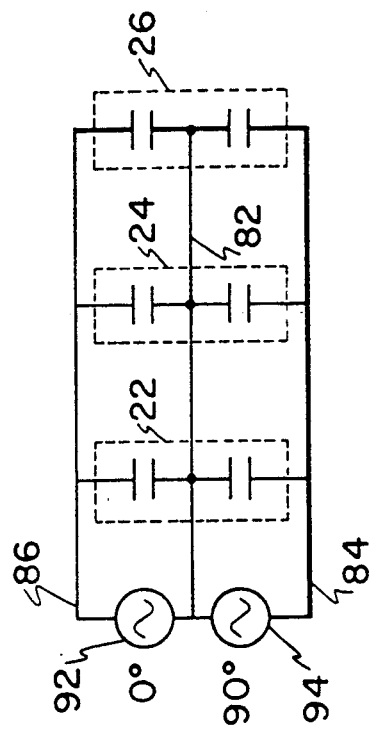
FIG. 6 is a schematic illustration of the invention employing two out of phase voltage sources to drive the piezoelectric actuators.

Electrical excitation of the motor may be by single phase, two phase or three phase power. FIG. 6 is a wiring diagram of a presently preferred two phase excitation source. Actuators 22, 24 and 26 are shown by dotted line boxes and the two capacitors in each box represent the capacitive load of the two stacks used in each actuator. Not shown since they would be obvious to those skilled in the art are the circuit elements representing the mechanical load (a resistor in parallel with each capacitor), or the circuit elements representing the back induced electric charge caused by the reverse effect of strain producing charge on the piezoelectric stack (controlled charge sources in parallel with each capacitor). Two sources of sinusoidal power lagging in phase by 90 degrees are indicated by 92 and 94. A power amplifier such as that described in U.S. Pat. No. 4,628,275 awarded to Applicant could be used for each of sources 92 and 94. The conductors indicated by numerals 82, 84 and 86 in FIG. 6 correspond to the wire designations in FIG. 3. In the event that this motor is to be used where only single phase power is available a single source of voltage could be used. However, circuit components (not shown) would have to be added to cause the voltage going to one of the two stacks to lag the voltage going to the other stack by approximately 90 degrees. This motor can also be used in industrial facilities where 3 phase power is available. Although the effective phase lag in the signal going to the stacks of each actuator would only be 60 degrees this is sufficient lag to produce the nutating rotary motion required of the crown rollers.

A method of demonstrating how the nutating motion of the crown rollers are converted to rotary motion is to use a rigid ring shaped object. Insert the index fingers from the right and left hands into the ring from opposite sides and hold them firmly against the inside of the ring shaped object. Then roll the fingers around each other while keeping the fingers pressed against the inside of the ring. The fingers do not rotate but they impart rotation to the ring.

The drive rollers are each centered by the opposing forces exerted by the two crown rollers driving each drive roller. The output shaft is held in stable position by a minimum of three drive rollers evenly spaced about the output shaft. The spacing of the drive rollers is set during fabrication of the motor, discussed hereafter. More drive rollers and actuators could be added for additional output power. None of the moving parts of this motor require bearing suspension and output shaft thrust is overcome by the conical shape of the drive roller bearing surfaces that match the conical bearing surfaces on the output shaft. When no voltage is applied to the actuators there will be only loose contact between the crown rollers and the drive rollers so long as the shaft seals are strong enough to support the weight of the rotating parts at rest. The seals carry negligible loads during motor operations. The amount of contact force between the moving parts depends upon the pressure exerted by the idler ring assembly and by the nutating crown rollers against the drive rollers. Since the crown roller contact force is proportional to the voltage applied to the stacks the contact force can be controlled by controlling the voltage. Thus the maximum output torque before internal slippage occurs is also controllable. Slipping is very undesirable because it produces heat and friction wear of the bearing surfaces. Normally there is no slipping in any of the rolling contacts so losses due to friction heating are zero. Extremely silent running is normal and a dry lubricant such as molybdenum disulphide is all that is required.

The output shaft rotating frequency depends upon the nutating frequency of the crown rollers, the diameter of the drive rollers, and the diameter of the output shaft. Since the nutating frequency of the crown roller can be well above 100 kHz very high output shaft speeds can be achieved even though the nutating radius is small.

Fabrication of the motor requires assembling the motor twice. The rotating components, i.e. the output shaft, drive rollers, and idler rings, are assembled in a fixture (not shown) and tightened with the adjusting mechanisms used to spread the idler rings. If the angles of the conical shaped bearing surfaces on the rotating components are moderate the rotating components can be assembled using one piece idler rings. If the angles are made steep it may be necessary to utilize split or hemispherical idler rings that can be bolted together. These rotating components which are now securely fastened together into a single unit, are removed from the fixture and installed in the housings along with the actuator stacks. This first assembly is made leaving out the ball bearings, the spacer ring, and gaskets so that the crown rollers will bottom out in the drive rollers. A slow curing adhesive is applied to the base of each actuator stack so that after correct positioning of the components the stacks will bond to the internal walls of the housings in the proper position. When the two housings are bolted together the actuator stacks are slid to a correct position and the adhesive allowed to cure.

After curing the motor is disassembled and the reassembled for the final time with the ball bearings, spacer ring and gaskets in place. Guide pins assure proper realignment of the parts during the second assembly of the motor. The bolt rings are torqued down to put a desired compressional preload on the stacks. When the actuators are not energized the shaft is held loosely in place and it, along with the other rotating parts, can be freely rotated; but with no precision because the crown rollers are not tightly sheared against the drive rollers. When the actuators are energized great rigidity and precision are achieved.

This completes the description of the invention. However it will be obvious to those skilled in the art that changes and modifications could be made to the invention. For example, because of the backward induced charge of an actuator due to an externally applied strain the motor could be adapted for use as a generator if the output shaft is rotated by a mechanical power source. An external source of voltage would have to be used initially to shear the actuator stacks so that the crown rollers make firm contact with the drive rollers.

After rotation and voltage output is established the external excitation can be removed and the stress induced in the actuator stacks will produce sinusoidal power at the terminals that can drive and external load. Thus the invention can be adapted to provide a full four quadrant power source and torque generator.

What is claimed is:

1. A piezoelectric motor for providing a powerful and compact source of variable speed rotary motion that can be coupled to a load, said motor comprising:

separable housing means that forms the outer casing of said motor;

rotatable means mounted in said housing means for rotation therein and including an output shaft means that extends from said housing so that the rotary motion of said rotatable means can be coupled to a load, and drive roller means positioned adjacent said output shaft means for engaging and rotating said output shaft means;

at least three nutating piezoelectric actuator means attached to the interior walls of said housing means and positioned adjacent said drive roller means, said piezoelectric actuator means deforming in both directions along two perpendicular axes when a voltage is applied thereto to engage and rotate said drive roller means and impart rotary motion to said output shaft means;

electrical conducting means mounted in said motor and connected to said piezoelectric actuator means, and electrical drive means connected to said electrical conducting means for providing a suitable voltage to said motor.

2. The piezoelectric motor recited in claim 1 wherein the assembled separable housing is substantially cylindrical and the output shaft included in said rotatable means is positioned so that the center line of said output shaft coincides with the center line of said housing, said rotatable means further including:

a pair of cone shaped bearing surfaces formed on said output shaft intermediate the ends thereof so that the cone shaped bearing surfaces are positioned centrally in said housing;

said drive roller means including at least three hollow drive rollers supported in said housing at equally spaced positions around said output shaft in a position to be engaged by said piezoelectric actuators attached to said housing, said drive rollers each having an external cone shaped bearing surface that precisely matches and engages the cone shaped bearing surfaces on said output shaft, and a cone shaped internal bearing surface that is engageable with one of the three piezoelectric actuators; and idler ring means encircling said drive rollers and rotated thereby that secure said drive rollers in position about said output shaft whereby said piezoelectric actuators when energized will rotate said drive rollers which in turn will rotate said output shaft and said idler ring means.

3. The piezoelectric motor recited in claim 2 wherein said separable housing includes two sections and each of said piezoelectric actuators comprises:

a first cylindrical piezoelectric stack having one end thereof fixed to one of the sections of said separable housing, a second cylindrical piezoelectric stack having one of its ends fixed to the other section of said separable housing, said first and second piezoelectric stacks being positioned in the housing sections so that their longitudinal axes coincide and their unmounted ends face each other when the motor is assembled;

a crown roller fixed on the unmounted end of each of said first and second piezoelectric stacks in a position to engage the internal bearing surface of their associated drive rollers when energized, and ball bearing means positioned between and contacting the crown rollers of said first and second piezoelectric stacks so that in assembled motors there is a preload applied to the first and second piezoelectric stacks.

4. The piezoelectric motor recited in claim 3 wherein each piezoelectric stack includes:

a base means for mounting the piezoelectric stack to the motor housing;

a plurality of piezoelectric wafers arranged to form a wafer stack that is fixed at one end to said base means, said piezoelectric wafers being polarized and electrodes applied thereto so that the wafer stack will deform in both directions along a first axis and in both directions along a second axis that is perpendicular to the first axis; and a truncated cone shaped crown roller mounted on said wafer stack opposite the end thereof fixed to said base means, the base of the truncated cone shaped crown roller being attached to the wafer stack so as to position the crown rollers tapered surface adjacent the internal bearing surface of the drive roller whereby during motion of the wafer stack the crown roller will engage the drive roller and cause rotation of the drive roller.

5. A piezoelectric motor as recited in claim 3 wherein each piezoelectric stack includes:

a base means for mounting the piezoelectric stack to the motor housing;

a plurality of polarized piezoelectric wafers bonded together to form a multi-layered wafer stack having one of its ends bonded to said base means, each layer of said wafer stack consisting of a plurality of flat rectangular wafers that have electrodes deposited on the flat sides thereof and are polarized identically so that when energized all the rectangular wafers in one layer will distort in the same direction;

said piezoelectric stack having the layers thereof arranged in a series of alternating layer pairs, one layer pair deflecting in opposite directions along a first axis and a second layer pair deflecting in opposite directions along a second axis that is perpendicular to the first axis, whereby the deflection of said layers is cumulative to provide a required deflection along two perpendicular axes; and a truncated cone shaped crown roller mounted on said wafer stack opposite the end thereof fixed to said base means, the base of the truncated cone shaped crown roller being attached to the wafer stack so as to position the crown rollers tapered surface adjacent the internal bearing surface of the associated drive roller whereby during deflection of the wafer stack the crown roller will engage the drive roller and cause rotation of the drive rollers.

6. A piezoelectric motor as recited in claim 5 wherein said electrical drive means delivers two sinusoidal voltages that are approximately 90 degrees out of phase with each other to each actuator means to cause the end of the wafer stack on which the crown roller is mounted to move in a substantial circle and cause nutation of the crown roller.

7. A piezoelectric stack for producing nutation having one end adapted to be fixed and the other end moveable, said piezoelectric stack comprising:

a plurality of polarized piezoelectric wafer sections bonded together to form a piezoelectric layer having upper and lower flat surfaces, said wafer sections being assembled with their polarizations oriented such that all of the wafer sections in a layer will shear in the same direction along a single axis of distortion when an electrical signal is applied thereto;

electrode means applied to the upper and lower flat surfaces of each layer for applying an electrical signal to the layer which causes the layer to shear along its axis of distortion in a direction determined by signal polarity;

a plurality of said piezoelectric layers arranged in alternating layer pairs and bonded together to form a piezoelectric stack, each layer pair having its axes of distortion oriented so that the layer pair will shear in either direction along a single axis that is perpendicular to the axis of distortion of adjacent layer pairs;

said piezoelectric stack having an insulating layer mounted on both of its ends;

crown roller means having a truncated cone shape attached to the moveable end of said piezoelectric stack, said crown roller means having one bearing surface to which a preload in the range of 100 to 500 pounds can be applied and a second tapered bearing surface that engages a rotatable object with great contact force to transfer the shear strain derived motive force of said piezoelectric stack to the rotatable object to drive said rotatable object in rotation; and electrical drive means connected to the electrodes of said piezoelectric stack for applying a selected electric signal to the wafers to result in nutation of the piezoelectric stack and the crown roller means attached thereto.

* * * * *